(12) United States Patent  
Lee et al.

(10) Patent No.: US 9,117,402 B2
(45) Date of Patent: Aug. 25, 2015

(54) ORGANIC LIGHT EMITTING DIODE DISPLAY DEVICE

(71) Applicant: LG Display Co., Ltd., Seoul (KR)

(72) Inventors: Bu-Yeol Lee, Goyang-si (KR); Jae-Myon Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/325,934

(22) Filed: Jul. 8, 2014

(65) Prior Publication Data

US 2015/0054719 A1 Feb. 26, 2015

(30) Foreign Application Priority Data

Aug. 21, 2013 (KR) ........................ 10-2013-0098906

(51) Int. Cl.
  *H01L 51/50* (2006.01)
  *G09G 3/32* (2006.01)
  *H01L 27/32* (2006.01)

(52) U.S. Cl.
  CPC ............ *G09G 3/3208* (2013.01); *H01L 27/326* (2013.01); *H01L 27/3279* (2013.01); *H01L 27/3218* (2013.01); *H01L 27/3246* (2013.01)

(58) Field of Classification Search
  CPC .......... H01L 27/3206–27/3218; G09G 3/3208; G09G 3/3226
  See application file for complete search history.

(56) References Cited

U.S. PATENT DOCUMENTS 8,530,910 B2 * 9/2013 Song et al. ........................ 257/88
8,816,331 B2 * 8/2014 Choi et al. ....................... 257/40
2006/0103940 A1 * 5/2006 Lo et al. ......................... 359/619
2006/0152531 A1 * 7/2006 Lin et al. ........................ 345/613
2011/0273409 A1 * 11/2011 Lee et al. ....................... 345/204
2012/0080680 A1 * 4/2012 Choi et al. ....................... 257/59
2012/0267611 A1 10/2012 Chung et al.
2013/0154910 A1 * 6/2013 Chu et al. ........................ 345/83
2013/0161656 A1 * 6/2013 Choi et al. ....................... 257/88
2014/0183479 A1 * 7/2014 Park et al. ....................... 257/40
2014/0307430 A1 * 10/2014 Lo et al. ......................... 362/231

FOREIGN PATENT DOCUMENTS

JP 2004-117689 A 4/2004

OTHER PUBLICATIONS

Chung, J. et al., "Transparent AMOLED Display Based on Bottom Emission Structure," *SID 10 Digest*, 2010, pp. 148-151, Chapter 11.4.
European Patent Office, Search Report and Opinion, European Patent Application No. 14176911.7, Feb. 9, 2015, seven pages.

* cited by examiner

*Primary Examiner* — Mariceli Santiago
(74) *Attorney, Agent, or Firm* — Fenwick & West LLP

(57) ABSTRACT

An organic light emitting diode display device includes a plurality of pixels each including a plurality sub-pixels, the plurality of sub-pixels in each pixel arranged along a first direction; and a signal line providing a signal to each of the plurality of sub-pixels, wherein each of the plurality of sub-pixels includes an emission part and a transparent part arranged along a second direction being perpendicular to the first direction, and the emission part is connected to the signal line to receive the signal, and wherein the emission parts in adjacent sub-pixels along the first direction are arranged in a checkerboard pattern.

17 Claims, 9 Drawing Sheets

ORGANIC LIGHT EMITTING DIODE DISPLAY DEVICE

CROSS-REFERENCE TO RELATED APPLICATION

The present application claims the benefit of Korean Patent Application No. 10-2013-0098906 filed in Korea on Aug. 21, 2013, which is herein incorporated by reference.

BACKGROUND

1. Technical Field

The present disclosure relates to an organic light emitting diode (OLED) display device, and more particularly, to a transparent OLED display device.

2. Related Art

An image display device has been developed to be thinner and have improved mobility and high performance. A liquid crystal display (LCD) device has largely replaced the cathode-ray-tube (CRT). Recently, an OLED display device having advantages in characteristics, e.g., color reproduction, thickness, power consumption, viewing angle, response time, and so on, than the LCD device is widely developed as a next-generation flat panel display device. The OLED display device is a self-emitting type device using an emitting layer of an organic material between electrodes. As a result, the OLED display device can be thinner than the LED device.

Recently, a transparent display device has been introduced and developed. With the transparent display device, both of an image screen and a background image are visible. Alternatively, the transparent display device is used as a window or as an image screen in a display driving time. The OLED display device is a suitable device for the transparent display device.

FIG. 1 is a schematic view of one pixel of the related art transparent OLED display device.

Referring to FIG. 1, one pixel PX of the related art transparent OLED includes a plurality of sub-pixels SPX1, SPX2 and SPX3 arranged in a vertical direction. An emission part EA of the first sub-pixel SPX1 is spaced apart from the emission part EA of the second sub-pixel SPX2 by a first distance D1. In addition, the emission part EA of the third sub-pixel SPX3 is spaced apart from the emission part EA of the second sub-pixel SPX2 by the same distance, i.e., the first distance D1.

The emission parts EA in the first to third sub-pixels SPX1, SPX2 and SPX3 should be spaced apart from each other by the first distance D1 to prevent a color mixture problem in adjacent sub-pixels.

In a white light emitting type OLED (i.e., a WRGB type), using a color filter as a color generating element, the first distance D1 can be controlled based on an emitting area, a distance between an emitting material layer (EML) and the color filter, or a width of a black matrix between the color filters. In a pixel independently emitting type OLED (i.e., an RGB type), the first distance D1 can be controlled based on the emitting area, a width of a bank B defining the emitting area, or a distance from the emitting material layer (EML) to a final image displaying surface.

The sub-pixels SPX1 to SPX3 have a vertical dimension greater than a horizontal dimension. The emission parts EA within each sub-pixel also has a vertical dimension greater than a horizontal dimension.

SUMMARY

Accordingly, the present disclosure is directed to an OLED display device that substantially obviates one or more of the problems due to limitations and disadvantages of the related art.

In accordance with the present disclosure, as embodied and broadly described herein, an organic light emitting diode display device includes a plurality of pixels each including a plurality sub-pixels, the plurality of sub-pixels in each pixel arranged along a first direction; and a signal line providing a signal to each of the plurality of sub-pixels, wherein each of the plurality of sub-pixels includes an emission part and a transparent part arranged along a second direction being perpendicular to the first direction, and the emission part is connected to the signal line to receive the signal, and wherein a first emission part in a first sub-pixel is adjacent to a transparent part of a second sub-pixel that is adjacent to the first sub-pixel in the first direction, the first sub-pixel and the adjacent sub-pixel arranged in a checkerboard pattern.

In another embodiment of the present disclosure, an organic light emitting diode pixel includes a first sub-pixel in a first column, a second sub-pixel in a second column adjacent to the first sub-pixel, a third sub-pixel in a third column adjacent to the second sub-pixel and a gate line connected to each of the first, second, and third sub-pixels. The gate line is transverse to the first, second, and third columns. Each of the first, second, and third sub-pixels includes an emission area and a transparent area wherein a first side of the emission area of the second sub-pixel in a direction of the second column is adjacent to the transparent area of the first sub-pixel in the first column, and a second side of the emission area of the second sub-pixel in the direction of the second column is adjacent to the transparent area of the third sub-pixel in the third column.

In another embodiment of the present disclosure, an organic light emitting diode device includes a first sub-pixel, a second sub-pixel and a third sub-pixel. Each of the first, second, and third sub-pixels includes an emission area and a transparent area adjacent to the emission area, the emission area and the transparent area configured along a first axis. The organic light emitting diode device also includes a gate line transverse to the first axis and connected to the emission area of each of the first, second, and third sub-pixels. Each emission area includes a first side and a second side opposite the first side, wherein the gate line is adjacent to the first side of the emission area of the first sub-pixel and is adjacent to the second side of the emission area of the second sub-pixel.

It is to be understood that both the foregoing general description and the following detailed description are exemplary and explanatory and are intended to provide further explanation of embodiments as claimed.

BRIEF DESCRIPTION OF THE DRAWINGS

The accompanying drawings, which are included to provide a further understanding and are incorporated in and constitute a part of this specification, illustrate embodiments of the disclosure.

DETAILED DESCRIPTION

Reference will now be made in detail to the preferred embodiments, examples of which are illustrated in the accompanying drawings.

Figure 2:
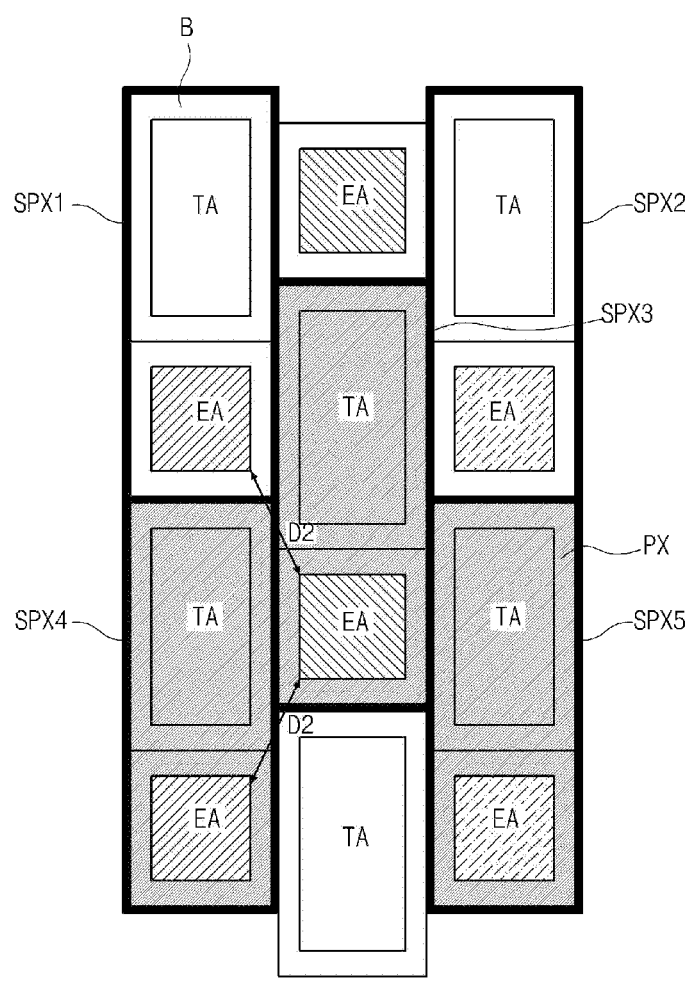
FIG. 2 is a schematic plane view of a pixel of an OLED display device according to a first embodiment.
Figure 3:
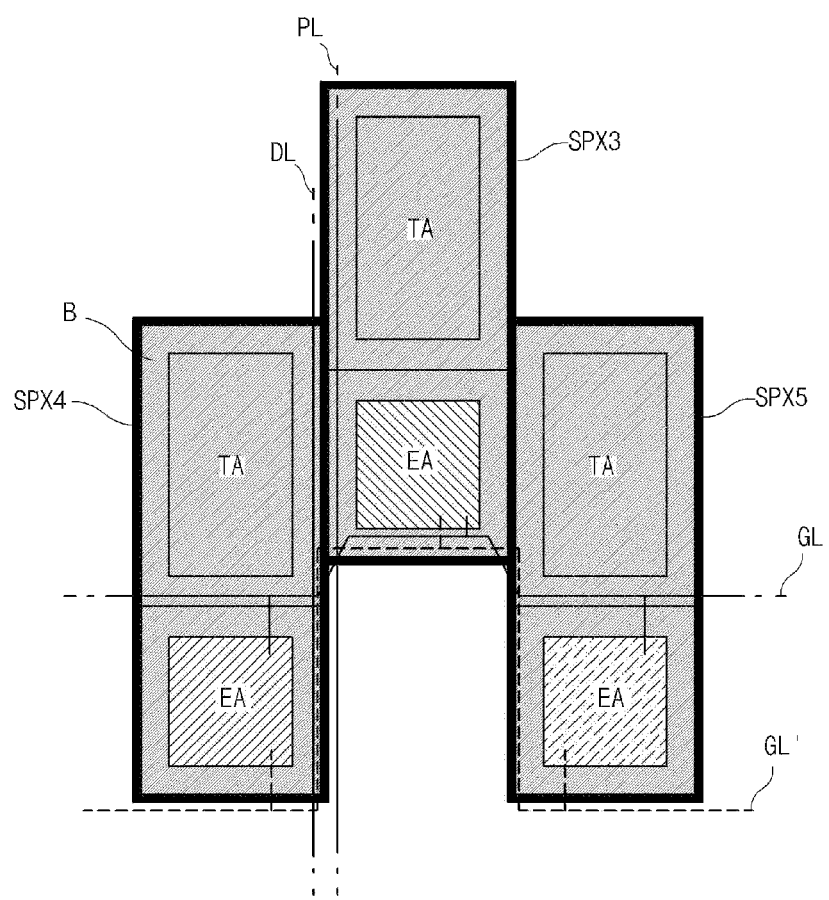
FIG. 3 is a schematic plane view showing signal lines in a pixel of the OLED display device according to the first embodiment.

FIG. 2 is a schematic plane view of a pixel of an OLED display device according to a first embodiment of the present disclosure, and FIG. 3 is a schematic plane view showing signal lines in a pixel of the OLED display device according to the first embodiment of the present disclosure. FIG. 3 is an enlarged view of a pixel PX in FIG. 2.

As shown in FIG. 2, in an OLED display device of the embodiment of the present disclosure, emission parts EA of adjacent sub-pixels SPX3, SP4 and SP5 in one pixel PX are arranged in a checkerboard pattern. The term "checkerboard" describes a structure (as shown in the FIGS. 2-9) in which an emission part of a sub-pixel is adjacent to at least a portion of a transparent part of an adjacent sub-pixel in a horizontal (or "x" direction). In addition, the emission parts EA in one and another pixels PX are arranged in a checkerboard pattern along a pixel arrangement direction.

Namely, a pixel PX includes emission parts EA that are arranged in a checkerboard pattern along an arrangement direction of the sub-pixels SPX1 to SPX5, the emission parts EA are spaced apart from each other by a second distance D2 and an area of a transparent part TA becomes larger. As a result, a color mixture problem in adjacent emission parts EA is prevented and the OLED display device has high transparency. The second distance D2 is equal to or larger than the first distance D1 in the related art OLED display device such that the color mixture problem in adjacent emission parts EA is sufficiently prevented.

In FIG. 2, a distance between the emission parts EA of the first and third sub-pixels SPX1 and SPX3 in different pixels PX is equal to a distance between the emission parts EA of the third to fifth pixels SPX3 to SPX5 in one pixel PX. Alternatively, the distance between the emission parts EA of the third to fifth pixels SPX3 to SPX5 in one pixel PX may be decreased to be equal to the first distance D1 such that a reliability of gray-scale expression can be improved.

Figure 1:
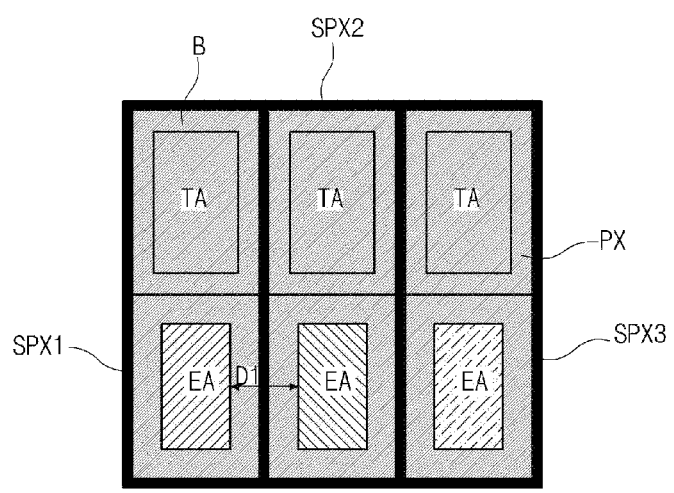
FIG. 1 is a schematic plane view of one pixel of the related art transparent OLED display device.

In addition, with the same area of the transparent part TA as the related art OLED display device in FIG. 1, the area of the pixel PX can be reduced to provide high resolution, or the area of the emission part EA can be increased to improve an optical efficiency.

In FIG. 2, one pixel PX includes three sub-pixels, i.e., the third to fifth sub-pixels SPX3 to SPX5, and the third to fifth sub-pixels SPX3 to SPX5 in one pixel PX are arranged along a first direction, i.e., a horizontal direction in FIG. 2. The third to fifth sub-pixels SPX3 to SPX5 emit different color lights to provide one gray scale. Alternatively, one pixel PX includes four or more sub-pixels.

Each of the sub-pixels SPX1 to SPX5 includes the emission part EA and the transparent part TA in divided regions. The emission part EA and the transparent part TA are arranged along a second direction being perpendicular to the first direction. Alternatively, the emission part EA and the transparent part TA may be arranged along the first direction or a third direction being different than the first and second directions.

As mentioned above, to arrange the emission parts EA in the third to fifth sub-pixels SPX3 to SPX5 in one pixel PX in the checkerboard pattern, the third to fifth sub-pixels SPX3 to SPX5 are arranged in the checkerboard pattern with respect to the first direction.

In the drawings, a bank layer B is positioned between the emission part EA and the transparent part TA and between adjacent sub-pixels SPX1 to SPX5. Namely, the bank layer B surrounds the emission part EA and the transparent part TA in the sub-pixels SPX1 to SPX5 to define the emission part EA and the transparent part TA. Alternatively, the bank layer B may surround the emission part EA except the transparent part TA.

As shown in FIG. 3, the OLED display device of the present disclosure includes signal lines GL, DL and PL. The signal lines GL, DL and PL are connected to the sub-pixels SPX1 to SPX5 to provide an electric signal. In more detail, the signal lines GL, DL and PL are connected to the emission part EA.

The signal lines GL, DL and PL do not overlap the transparent part TA or the emission part EA. The signal lines GL, DL and PL overlap the bank layer B such that the transparency and the emitting efficiency of the OLED display device are not affected by the signal lines GL, DL and PL. When the bank layer B surrounds the emission part EA except the transparent part TA, the signal lines GL, DL and PL may be exposed without the bank layer B. There is no limitation in positions of the signal lines GL, DL and PL as long as the signal lines GL, DL and PL overlap the bank layer B.

The signal lines includes a gate line GL, a data line DL and a power line PL. In addition, the signal lines may further includes various signal lines required to drive the pixel.

At least one of the signal lines GL, DL and PL extends along the first direction. Since the signal lines GL, DL and PL are connected to the emission part EA to provide the electric signal, the signal line, which extends along the first direction, is disposed to be adjacent to the emission part EA and is alternately across the sub-pixels SPX1 to SPX5 to have a minimum path.

Generally, the signal lines GL, DL and PL are disposed between adjacent sub-pixels SPX1 to SPX5 to define the sub-pixels SPX1 to SPX5 and have a straight line shape. However, since the emission parts EA in the present disclosure are arranged in the checkerboard pattern, at least one of the signal lines GL, DL and PL may be across the sub-pixels SPX1 to SPX5 and may have a non-straight line shape.

In FIG. 3, the gate line GL, the data line DL and the power line PL are shown as the signal line, and the gate line GL extends along the first direction. The rest of the signal lines, i.e., the data line DL and the power line PL, are disposed between adjacent sub-pixels SPX1 to SPX5. In more detail, the data line DL and the power line PL are arranged to overlap the bank layer B defining the emission part EA and the transparent part TA.

On the other hand, a part of the gate line GL extends into the emission part EA to serve as a gate electrode of a switching transistor (not shown) for driving the emission part EA.

FIG. 3 shows the data line DL and the power line PL disposed between the third and fourth sub-pixels SPX3 and SPX4 and omits the data line and the power line between other sub-pixels. This configuration and omission are the same in other drawings.

The gate line GL extending along the first direction is connected to the emission part EA and is across the fourth and fifth sub-pixels SPX4 and SPX5 to have a minimum path. The gate line GL includes a bent portion with a pre-determined angle at a boundary of adjacent sub-pixels SPX3 to SPX5. The gate line GL is across a space between the emission part TA and the transparent part TA in the fourth and fifth sub-pixels SPX4 and SPX5 and overlaps the bank layer B. Namely, the gate line GL does not overlap the emission part EA and the transparent part TA.

In FIG. 3, the shape of a conventional gate line GL' is shown as a dotted line shows a portion of the gate line when the gate line is disposed between sub-pixels SPX1 to SPX5. To extend along a boundary between adjacent sub-pixels SPX1 to SPX5, which are arranged in the checkerboard pattern, the shape of the conventional gate line GL' is longer than the gate line GL. That is, in some examples, gate line GL is alternately adjacent to a first side and a second side of emission parts in adjacent sub-pixels.

With the longer gate line, the signal delay in the gate line and the resistance of the gate line are increased, and the operation efficiency of the OLED display device is decreased. However, in the present disclosure, the gate line GL has a minimum path such that the above problems are not generated.

When the signal line is bent by 90 degrees or more, the resistance of the signal line is increased in comparison to the signal line being straight or being bent by less than 90 degrees such that the signal delay is generated in the signal line.

Accordingly, the bent angle in the gate line GL is less than 90 degrees (0<bent angle<90), and preferably becomes smaller in possible range.

The positions and the bent angles of the signal lines GL, DL and PL are not limited to those in FIG. 3. FIG. 3 shows the gate line GL overlapping the bank layer B in the transparent part TA of the fourth sub-pixel SPX4. Alternatively, the gate line GL may be disposed at a boundary between the emission part EA and the transparent part TA or may overlap the bank layer B in the emission part EA.

Figure 4:
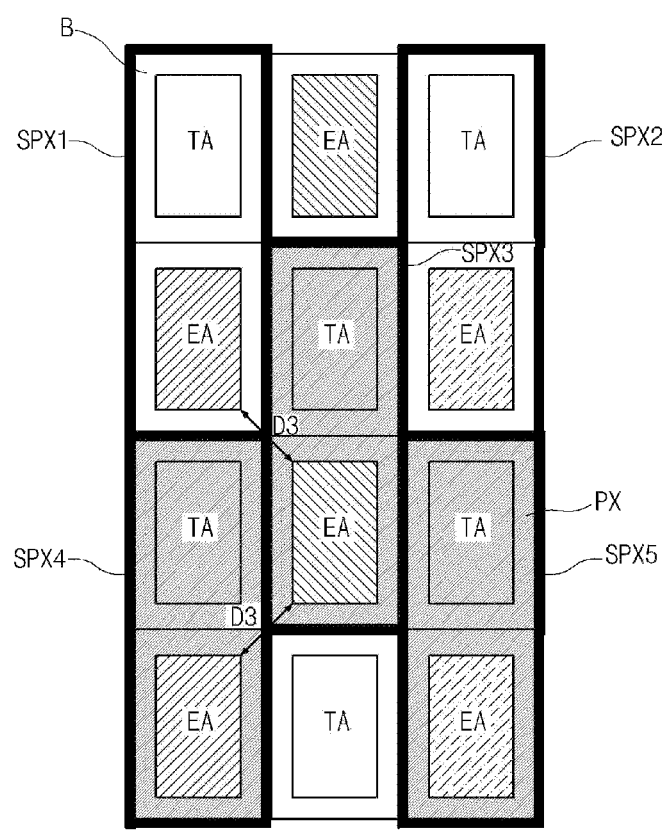
FIG. 4 is a schematic plane view of a pixel of an OLED display device according to a second embodiment.
Figure 5:
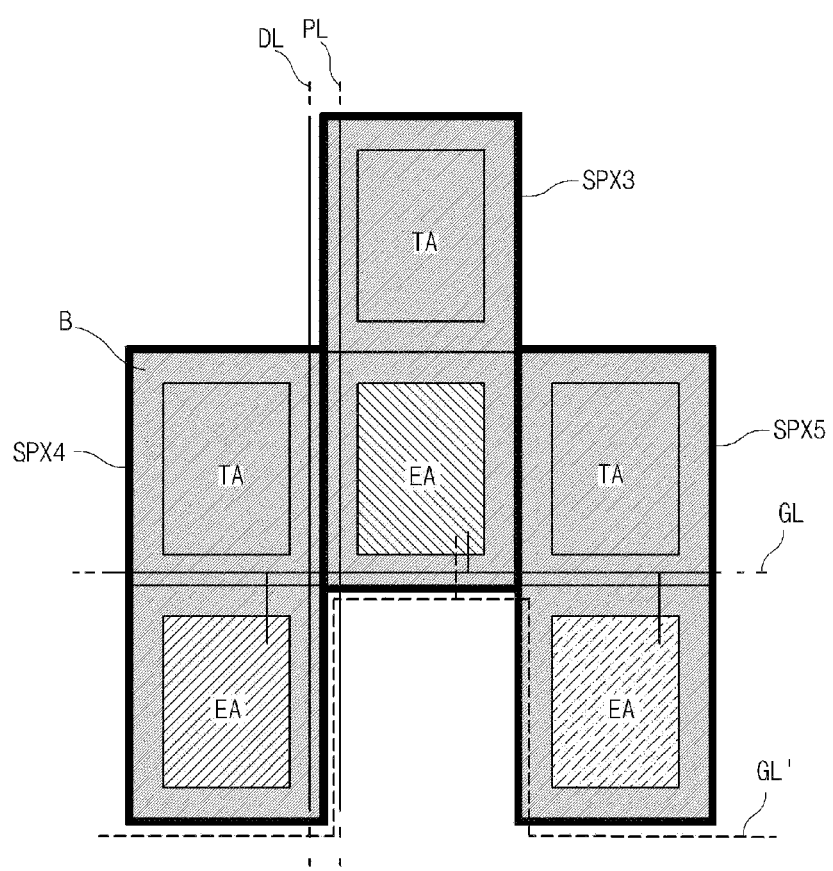
FIG. 5 is a schematic plane view showing signal lines in a pixel of the OLED display device according to the second embodiment.

FIG. 4 is a schematic plane view of a pixel of an OLED display device according to a second embodiment of the present disclosure, and FIG. 5 is a schematic plane view showing signal lines in a pixel of the OLED display device according to the second embodiment of the present disclosure. FIG. 5 is an enlarged view of a pixel PX in FIG. 4.

In the OLED display device according to the second embodiment of the present disclosure, an area of an emission part EA is increased to be equal to an area of the transparent part TA with the checkerboard arrangement of sub-pixels SPX1 to SPX5 and the same area of the transparent part TA. As a result, the emitting efficiency is improved.

In addition, in the OLED display device according to the second embodiment of the present disclosure, an area of one pixel PX is reduced such that high resolution OLED display device can be provided.

In more detail, in FIG. 4, one pixel PX includes the third to fifth sub-pixels SPX3 to SPX5 arranged along a first direction, i.e., a horizontal direction. The third to fifth sub-pixels SPX3 to SPX5 are arranged in a checkerboard pattern. In addition, each of the third to fifth sub-pixels SPX3 to SPX5 is divided into two parts by a line along the first direction, and the emission part EA and the transparent part TA are arranged along a second direction being perpendicular to the first direction.

Since the sub-pixels SPX3 to SPX5 are arranged in the checkerboard pattern, the emitting parts EA in the sub-pixels SPX3 to SPX5 are arranged in a checkerboard pattern and have a third distance D3 from each other. The third distance D3 is equal to or larger than the first distance D1 in FIG. 1 such that the color mixture problem in adjacent emission parts EA is sufficiently prevented.

In FIG. 5, a gate line GL among the signal lines GL, DL and PL extends along the first direction and is alternately across the sub-pixels SPX3 to SPX5. In the OLED display device of the second embodiment, since the emission part EA and the transparent part TA have the same area, the gate line GL, which is alternately across the sub-pixels SPX3 to SPX5, does not have a bent portion. Namely, the gate line GL has a straight line shape.

On the other hand, a part of the gate line GL extends into the emission part EA to serve as a gate electrode of a switching transistor (not shown) for driving the emission part EA.

Similar to FIG. 3, the gate line GL among the signal lines are disposed along the first direction. However, it is not limited thereto. Alternatively, the data line DL or the power line PL may extend along the first direction and may be alternately across the sub-pixels SPX3 to SPX5.

The positions and the bent angles of the signal lines GL, DL and PL are not limited to those in FIG. 5. FIG. 5 shows the gate line GL overlapping the bank layer B in the transparent part TA of the fourth sub-pixel SPX4. Alternatively, the gate line GL may be disposed at a boundary between the emission part EA and the transparent part TA or may overlap the bank layer B in the emission part EA.

In FIG. 5, a conventional gate line GL' is shown as a dot line shows a portion of the gate line when the gate line is disposed between sub-pixels SPX1 to SPX5. To extends along a boundary between adjacent sub-pixels SPX1 to SPX5, which are arranged in the checkerboard pattern, the conventionally shaped gate line GL' is longer than the gate line GL.

With the longer gate line, the signal delay in the gate line and the resistance of the gate line are increased, and the operation efficiency of the OLED display device is decreased. However, in the present disclosure, the gate line GL has a minimum path such that the above problems are not generated.

When the signal line is bent by 90 degrees or more, the resistance of the signal line is increased in comparison to the signal line being straight or being bent by less than 90 degrees such that the signal delay is generated in the signal line.

Accordingly, it is preferable that the gate line GL has a straight line shape as shown in FIG. 5.

Figure 6:
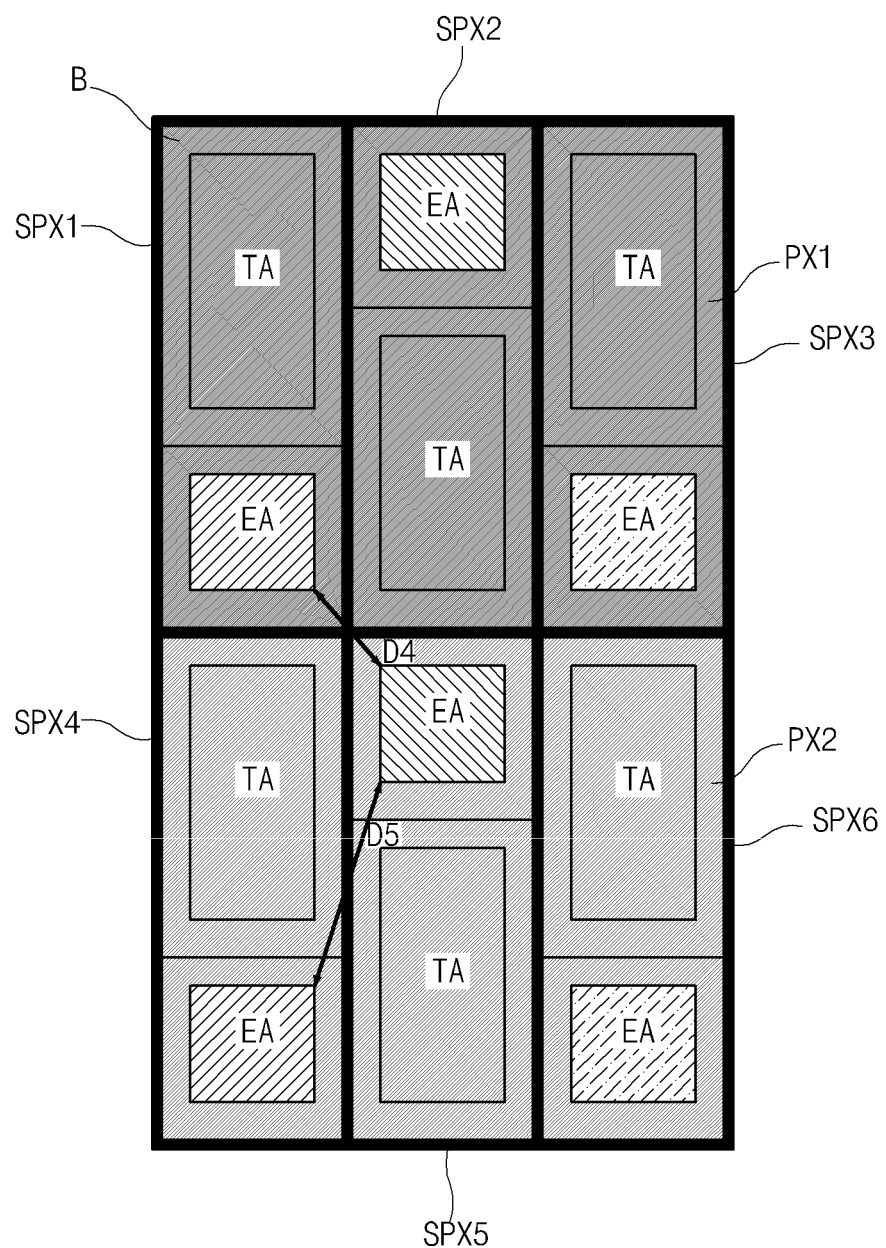
FIG. 6 is a schematic plane view of a pixel of an OLED display device according to a third embodiment.
Figure 7:
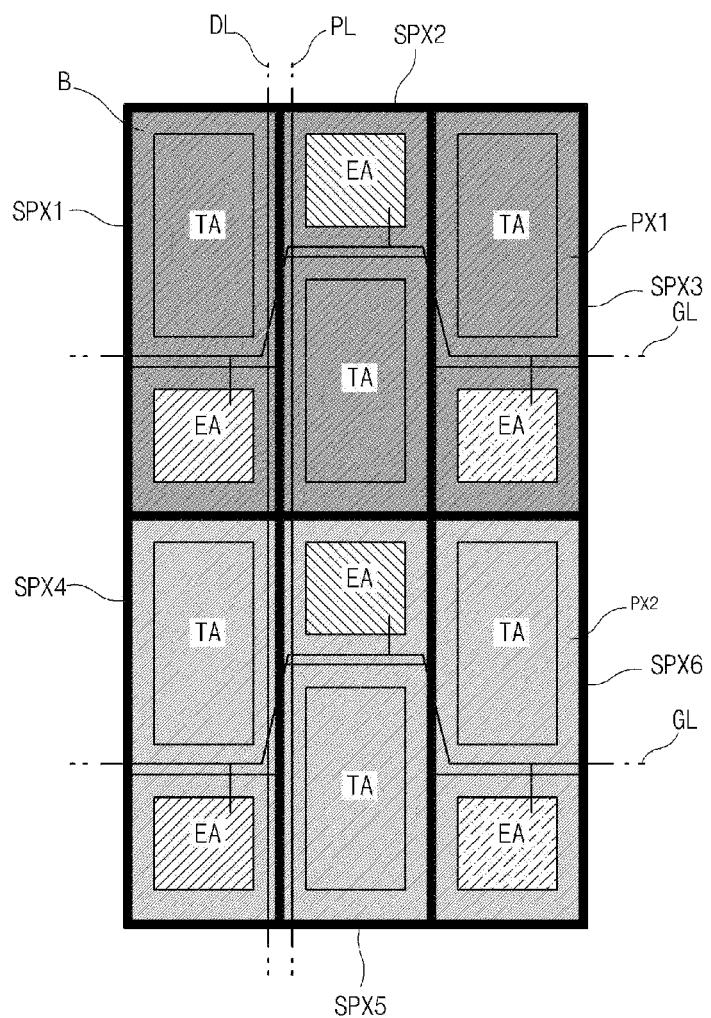
FIG. 7 is a schematic plane view showing signal lines in a pixel of the OLED display device according to the third embodiment.

FIG. 6 is a schematic plane view of a pixel of an OLED display device according to a third embodiment of the present disclosure, and FIG. 7 is a schematic plane view showing signal lines in a pixel of the OLED display device according to the third embodiment of the present disclosure. FIG. 7 shows signal lines with the pixel arrangement.

Referring to FIG. 6, a first pixel PX1 includes first to third sub-pixels SPX1 to SPX3, and a second pixel SPX2 includes fourth to sixth sub-pixels SPX4 to SPX6. In each of the first and second pixels PX1 and PX2, the arrangement of an emission part EA and a transparent part TA in adjacent sub-pixels SPX1 to SPX6 is reversed. Namely, unlike the first and second embodiments, in which an entire sub-pixel is offset from the entire neighboring sub-pixels, the sub-pixels of the embodiment shown in FIG. 6 are not offset from one another, but rather have co-linear boundaries. Instead, to achieve the checkerboard pattern, the relative positions of the emission part EA and the transparent part TA in the sub-pixels SPX1 to SPX6 is reversed.

In addition, the emission part EA in the first pixel PX1 is spaced apart from the emission part EA in the second pixel PX2 by a fourth distance D4, and the emission part EA in one sub-pixel SPX1 to SPX6 of one pixel PX1 and PX2 is spaced apart from the emission part EA in another sub-pixel SPX1 to SPX6, which is adjacent to one sub-pixel SPX1 to SPX6, of the one pixel PX1 and PX2 by a fifth distance D5. As shown in FIG. 6, when the area of the transparent part TA is larger than the emission part EA, the fourth distance D4 is smaller than the fifth distance D5. The fourth and fifth distances D4 and D5 are equal to or larger than the first distance D1 in FIG. 1 such that the color mixture problem in adjacent emission parts EA is sufficiently prevented.

In addition, with the same area of the transparent part TA and the emission part EA as the related art OLED display device in FIG. 1, the area of the sub-pixels SPX1 to SPX6 can be reduced to provide high resolution OLED display device.

On the other hand, in FIG. 7, the gate line GL among the signal lines GL, DL and PL extends along the first direction. The rest signal lines, i.e., the data line DL and the power line PL, are disposed between adjacent sub-pixels SPX1 to SPX6. In more detail, the data line DL and the power line PL are arranged to overlap the bank layer B defining the emission part EA and the transparent part TA.

A part of the gate line GL extends into the emission part EA to serve as a gate electrode of a switching transistor (not shown) for driving the emission part EA. The signal line extending along the first direction is not limited to the gate line GL. The data line DL and the power line PL may extend along the first direction.

The gate line GL is across the first to sixth sub-pixels SPX1 to SPX6 to be closely adjacent to the emission part EA. The gate line GL may be disposed between the emission part EA and the transparent part TA in each sub-pixel SPX1 to SPX6 and may overlap the bank layer B formed between the emission part EA and the transparent part TA. The bank layer B surrounds the emission part EA and the transparent part TA to define the emission part EA and the transparent part TA. Alternatively, the bank layer B may surround the emission part EA except the transparent part TA such that an area of the transparent part TA and the transparency of the device are increased and the transparency.

In the OLED display device of the third embodiment of the present disclosure, by maintaining an area of the emission part EA as that in the related art device and increasing an area of the transparent part TA, the transparency of the OLED display device is improved. Alternatively, by maintaining an area of the emission part EA and the transparent part TA as those in the related art device and decreasing an area of the sub-pixels SPX1 to SPX6, an area of the pixels PX1 and PX2 is decreased such that the resolution of the OLED display device is improved.

Figure 8:
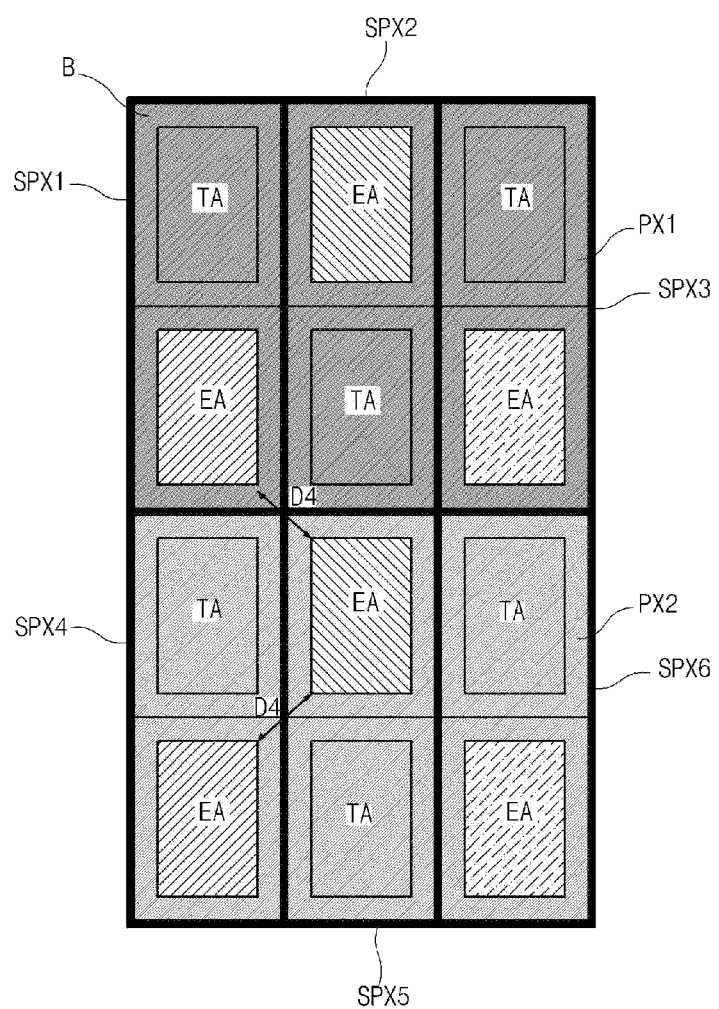
FIG. 8 is a schematic plane view of a pixel of an OLED display device according to a fourth embodiment.
Figure 9:
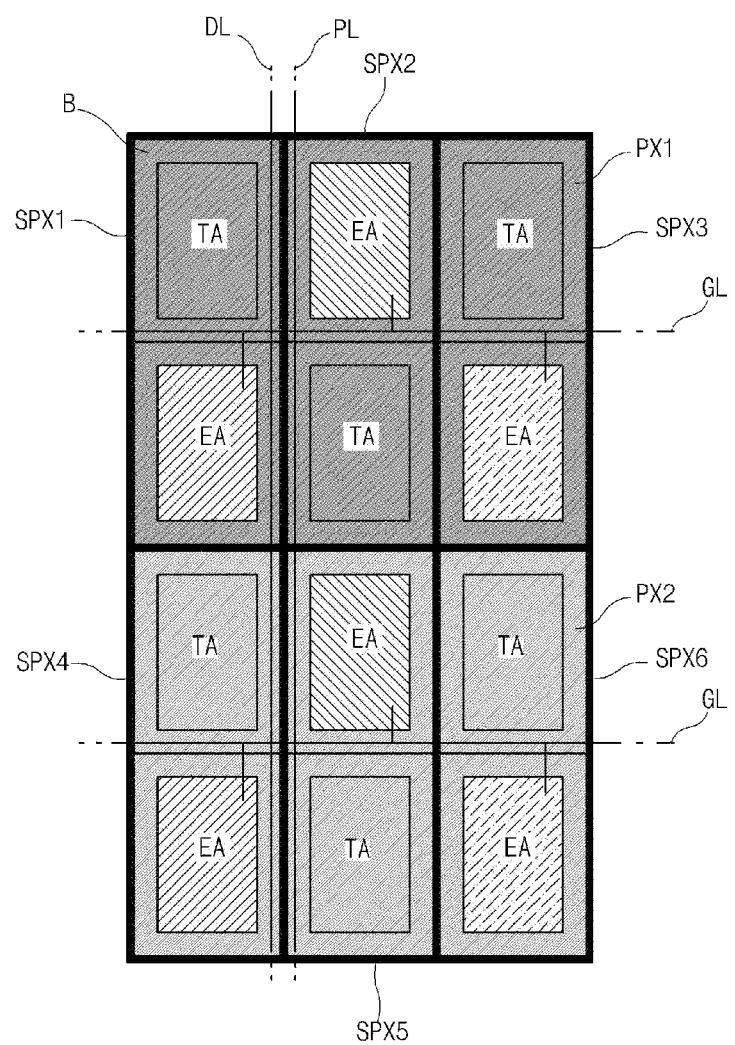
FIG. 9 is a schematic plane view showing signal lines in a pixel of the OLED display device according to the fourth embodiment.

FIG. 8 is a schematic plane view of a pixel of an OLED display device according to a fourth embodiment of the present disclosure, and FIG. 9 is a schematic plane view showing signal lines in a pixel of the OLED display device according to the fourth embodiment of the present disclosure. FIG. 9 shows signal lines with the pixel arrangement.

Similar to the arrangement in FIG. 6, in each of the first and second pixels PX1 and PX2 in FIG. 8, the arrangement of an emission part EA and a transparent part TA in adjacent sub-pixels SPX1 to SPX6 is reversed. Different from the configuration in FIG. 6, the emission part EA and the transparent part TA in FIG. 8 have substantially the same area. In this instance, the emission parts EA in one pixel PX1 and PX2 and the emission parts EA in adjacent pixels PX1 and PX2 are spaced apart from each other by the same distance, i.e., a fourth distance D4. The fourth distance D4 is equal to or larger than the first distance D1 in FIG. 1 such that the color mixture problem in adjacent emission parts EA is sufficiently prevented.

A first pixel PX1 includes first to third sub-pixels SPX1 to SPX3 arranged along a first direction, i.e., a horizontal direction, and a second pixel SPX2 includes fourth to sixth sub-pixels SPX4 to SPX6 arranged along the first direction. Each of the first to sixth sub-pixels SPX1 and SPX6 includes an emission part EA and a transparent part TA in divided regions, and the emission part EA and the transparent TA are arranged along a second direction being perpendicular to the first direction.

FIG. 9 shows signal lines GL, DL and PL connected to each of the sub-pixels SPX1 to SPX6. In more detail, the signal lines GL, DL and PL are connected to the emission part EA of the sub-pixels SPX1 to SPX6. A part of the gate line GL extends into the emission part EA to serve as a gate electrode of a switching transistor (not shown).

The signal lines GL, DL and PL are connected to the emission part EA to provide the electric signal. In addition, at least one of the signal lines GL, DL and PL extends along the first direction as a direction of the sub-pixel arrangement. In FIG. 9, the gate line GL extends along the first direction. However, according to a direction of the sub-pixel arrangement, the signal line being disposed along the sub-pixel arrangement direction is changed. When the sub-pixels SPX1 to SPX6 in each of the pixels PX1 and PX2 are arranged along the second direction, i.e. a vertical direction, at least one of the data line DL and the power line PL extends along the sub-pixel arrangement direction.

The gate line GL is arranged along the first direction, i.e., the sub-pixel arrangement direction, and is across the first pixel PX1 to be connected to the emission part EA of the sub-pixels SPX1 to SPX3 in the first pixel PX1. The gate line GL is disposed between the emission part EA and the transparent part TA in the first pixel PX1 to SPX6 to be closely adjacent to the emission part EA.

The rest of the signal lines, i.e., the data line DL and the power line PL, are disposed between adjacent sub-pixels SPX1 to SPX6. A bank layer B may be formed to surround the emission part EA and the transparent part TA and to be disposed between the emission part EA and the transparent part TA. The signal lines GL, DL and PL are disposed to overlap the bank layer B. The bank layer B may be formed to surround the emission part EA except the transparent part TA to increase an area of the transparent part TA. As a result, a transparency of the OLED display device is increased.

In the OLED display device according to the embodiments of the present disclosure, each of the pixels PX1 and PX2 includes three sub-pixels. However, it is not limited thereto and each of the pixels PX1 and PX2 may include four or more sub-pixels. Each of the sub-pixels emits light having a color selected from red, green, blue, white, yellow, magenta and cyan.

In the present disclosure, because the emission parts EA in adjacent sub-pixels are arranged in a checkerboard pattern, not in parallel, the OLED display device includes the emission part EA having the same area as the related OLED display device, where the emission parts EA are disposed in parallel, and the transparent part TA having the increased area. As a result, the OLED display device of the present disclosure has high transparency.

In addition, by maintaining an area of the transparent part TA and increasing an area of the emission part EA, the emitting efficiency of the OLED display device is improved.

Moreover, by decreasing an area of the sub-pixels SPX1 to SPX6 and maintaining an area of each of the emission part EA and the transparent part TA, the OLED display device of the present disclosure has a high resolution.

It will be apparent to those skilled in the art that various modifications and variations can be made in the present disclosure without departing from the spirit or scope of the disclosure. Thus, it is intended that the present disclosure cover the modifications and variations of this disclosure provided they come within the scope of the appended claims and their equivalents.

What is claimed is:

1. An organic light emitting diode display device, comprising:
   a plurality of pixels, each pixel including a plurality of sub-pixels, the plurality of sub-pixels in each pixel arranged along a first direction; and
   a signal line providing a signal to each of the plurality of sub-pixels,
   wherein each of the plurality of sub-pixels includes an emission part and a transparent part arranged along a second direction perpendicular to the first direction, the emission part connected to the signal line to receive the signal, and
   wherein a first emission part in a first sub-pixel is adjacent to a transparent part of a second sub-pixel that is adjacent to the first sub-pixel in the first direction, the first sub-pixel and the adjacent sub-pixel arranged in a checkerboard pattern in which each of the sub-pixels in each of the plurality of pixels is offset from the sub-pixels of adjacent pixels.

2. The device according to claim 1, further comprising a bank layer surrounding the emission part and the transparent part, wherein the signal line overlaps the bank layer.

3. The device according to claim 1, further comprising a bank layer surrounding the emission part except the transparent part.

4. The device according to claim 1, wherein the signal line includes a gate line, a data line and a power line, and the signal line is disposed between adjacent sub-pixels.

5. The device according to claim 1, wherein at least one of the signal line is disposed along the first direction.

6. The device according to claim 5, wherein the signal line, which is disposed along the first direction, is alternately across the plurality of sub-pixels.

7. The device according to claim 6, wherein an area of the emission part is smaller than an area of the transparent part, and the signal line, which is alternately across the plurality of sub-pixels, includes a bent portion.

8. The device according to claim 1, wherein a relative portion of the emission part and the transparent part in the sub-pixel is reversed at adjacent sub-pixels along the first direction.

9. The device according to claim 8, wherein the signal line includes a gate line, a data line and a power line, and the signal line is disposed between adjacent sub-pixels.

10. The device according to claim 9, wherein at least one of the lines of the signal line is disposed along the first direction.

11. The device according to claim 10, wherein the signal line, which is disposed along the first direction, is across the plurality of sub-pixels.

12. The device according to claim 11, wherein an area of the emission part is smaller than an area of the transparent part, and the signal line, which is alternately across the plurality of sub-pixels, includes a bent portion.

13. An organic light emitting diode pixel, comprising:
    a first sub-pixel in a first column, a second sub-pixel in a second column adjacent to the first sub-pixel, and a third sub-pixel in a third column adjacent to the second sub-pixel; and
    a gate line connected to each of the first, second, and third sub-pixels, the gate line transverse to the first, second, and third columns,
    wherein the gate line includes at least one bent portion of less than 90 degrees,
    wherein each of the first, second, and third sub-pixels includes an emission area and a transparent area, and
    wherein a first side of the emission area of the second sub-pixel in a direction of the second column is adjacent to the transparent area of the first sub-pixel in the first column, and a second side of the emission area of the second sub-pixel in the direction of the second column is adjacent to the transparent area of the third sub-pixel in the third column.

14. The organic light emitting diode pixel of claim 13, wherein the gate line is adjacent to a top edge of the emission area of the first sub-pixel, a bottom edge of the emission area of the second sub-pixel, and a top edge of the emission area of the third sub-pixel.

15. An organic light emitting diode device, comprising:
    a first sub-pixel, a second sub-pixel and a third sub-pixel, each of the first, second, and third sub-pixels including an emission area and a transparent area adjacent to the emission area, the emission area and the transparent area configured along a first axis; and
    a gate line transverse to the first axis and adjacent to the emission area of each of the first, second, and third sub-pixels, each emission area including a first side and a second side opposite the first side, the gate line adjacent to the first side of the emission area of the first sub-pixel and adjacent to the second side of the emission area of the second sub-pixel.

16. The organic light emitting diode device of claim 15, further comprising the gate line adjacent to the first side of the emission area of a third sub-pixel.

17. The organic light emitting diode device of claim 15, wherein the gate line includes at least one bent portion of less than 90 degrees approximately at an interface between the first sub-pixel and the second sub-pixel.

* * * * *